(12) United States Patent
Hong et al.

(10) Patent No.: US 8,204,552 B2
(45) Date of Patent: Jun. 19, 2012

(54) METHOD FOR PREDICTING AVAILABLE TIME REMAINING ON BATTERY IN MOBILE DEVICES BASED ON USAGE PATTERNS

(75) Inventors: James Won-Ki Hong, Kyungsangbuk-do (KR); Joon-Myung Kang, Kyungsangbuk-do (KR)

(73) Assignee: Postech Academy-Industry Foundation, Pohang-Shi, Kyungsangbuk-Do (KR)

( * ) Notice: Subject to any disclaimer, the term of this patent is extended or adjusted under 35 U.S.C. 154(b) by 223 days.

(21) Appl. No.: 12/453,141

(22) Filed: Apr. 30, 2009

(65) Prior Publication Data
US 2009/0312072 A1 Dec. 17, 2009

(30) Foreign Application Priority Data
Jun. 11, 2008 (KR) ........................ 10-2008-0054424

(51) Int. Cl.
*H04B 1/38* (2006.01)
(52) U.S. Cl. ......... 455/573; 455/571; 455/572; 455/574
(58) Field of Classification Search .......... 455/573–574; 370/328, 338
See application file for complete search history.

(56) References Cited

U.S. PATENT DOCUMENTS
5,530,362 A 6/1996 Boehm et al.
6,272,184 B1 * 8/2001 Ta et al. ........................ 375/334

| 2004/0017180 A1* | 1/2004 | Cook | 320/132 |
| 2005/0044572 A1* | 2/2005 | Osumi | 725/62 |
| 2009/0126023 A1* | 5/2009 | Yun et al. | 726/25 |

FOREIGN PATENT DOCUMENTS
| EP | 0 854 583 | | 7/1998 | |
| GB | EP 0 854 583 A1 * | | 7/1998 | 320/133 |
| JP | 7-143234 | | 6/1995 | |
| JP | 09-181804 A | | 11/1997 | |
| JP | 2006-101584 | | 4/2006 | |
| KR | 10-2006-0075444 A | | 4/2006 | |

OTHER PUBLICATIONS

Office Action issued on Dec. 7, 2010 in corresponding JP Application No. 2009-118340.
Office Action issued on Feb. 25, 2010 in corresponding Korean Application No. 10-2008-0054424.

\* cited by examiner

*Primary Examiner* — Dwayne Bost
*Assistant Examiner* — Inder Mehra
(74) *Attorney, Agent, or Firm* — Bacon & Thomas, PLLC

(57) ABSTRACT

A method for predicting an available time of a battery in a mobile device includes: defining one or more modes depending on usage patterns of the mobile device that affects power consumption of the battery; creating time-series data about power consumption amount of the battery and use time of the battery in each mode; calculating, based on the time-series data, average power consumption rate per each mode and use time rate; and predicting the available time of the battery, based on the average power consumption rate per each mode and the use time rate per each mode.

4 Claims, 4 Drawing Sheets

METHOD FOR PREDICTING AVAILABLE TIME REMAINING ON BATTERY IN MOBILE DEVICES BASED ON USAGE PATTERNS

FIELD OF THE INVENTION

The present invention relates to a method for predicting available time remaining on a battery in a mobile device based on usage patterns, and more specifically, to a method for predicting available time of a battery in a mobile device based on power consumption amount and use time of the battery depending on operations of the mobile device affecting power consumption of the battery.

BACKGROUND OF THE INVENTION

As more people use mobile devices or mobile communication terminals by remarkable advances in mobile communication techniques and service development of recent years, predicting available time of a battery in a mobile device in advance has become one of essential techniques.

Conventional methods for predicting available time of the battery in the mobile device typically involved calculating the remaining battery capacity based on a reference value that is given experimentally by battery manufacturers or mobile device manufacturers, before the mobile device comes out into the market. In addition, some studies were based on a theoretical model or a simulation on the use of a battery, such as a method in which a standby time of a mobile device is calculated based on an average of consumed current in the battery.

Recently, a new approach to statistically predicting available time of the battery was introduced. According to this new approach, available time of the battery, from after voltage of the battery currently being used reaches a certain level until the power of the mobile device completely goes out, is obtained from statistical data on an actual use time of the battery.

However, these conventional methods for predicting available time of the battery described above are mainly focused on prediction of available time of the battery or a use time of the battery by ordinary users, through amount of current consumption in a circuit of the mobile device.

Therefore, available time of the battery was estimated in a uniform manner, despite the fact that users have their own patterns of using mobile devices.

The user of the mobile device is only informed of available time of the battery estimated from ordinary users, and not provided with any estimated result that is particularly suitable for his or her personal usage pattern of the mobile device. Therefore, the conventional methods for predicting the available time of the battery has limited effects in efficient use of the battery or detection of abnormal battery abuse.

SUMMARY OF THE INVENTION

It is, therefore, an object of the present invention to provide a method for effectively predicting available time of a battery in a mobile device based on usage patterns affecting power consumption of the battery.

In accordance with the present invention, there is provided a method for predicting available time of a battery in a mobile device, including:

defining one or more modes depending on usage patterns of the mobile device that affects power consumption of the battery;

creating time-series data about power consumption amount of the battery and use time of the battery in each mode;

calculating, based on the time-series data, average power consumption rate per each mode and use time rate; and predicting the available time of the battery, based on the average power consumption rate per each mode and the use time rate per each mode.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENTS

Hereinafter, the operational principle of the present invention will be described in detail with reference to the accompanying drawings. In the following description, well-known functions or constitutions will not be described in detail if they would obscure the invention in unnecessary detail. Also, the terminologies to be described below are defined in consideration of functions in the present invention and may vary depending on a user's or an operator's intention or practice. Thus, the definitions should be defined based on all the contents of the specification.

Figure 1:
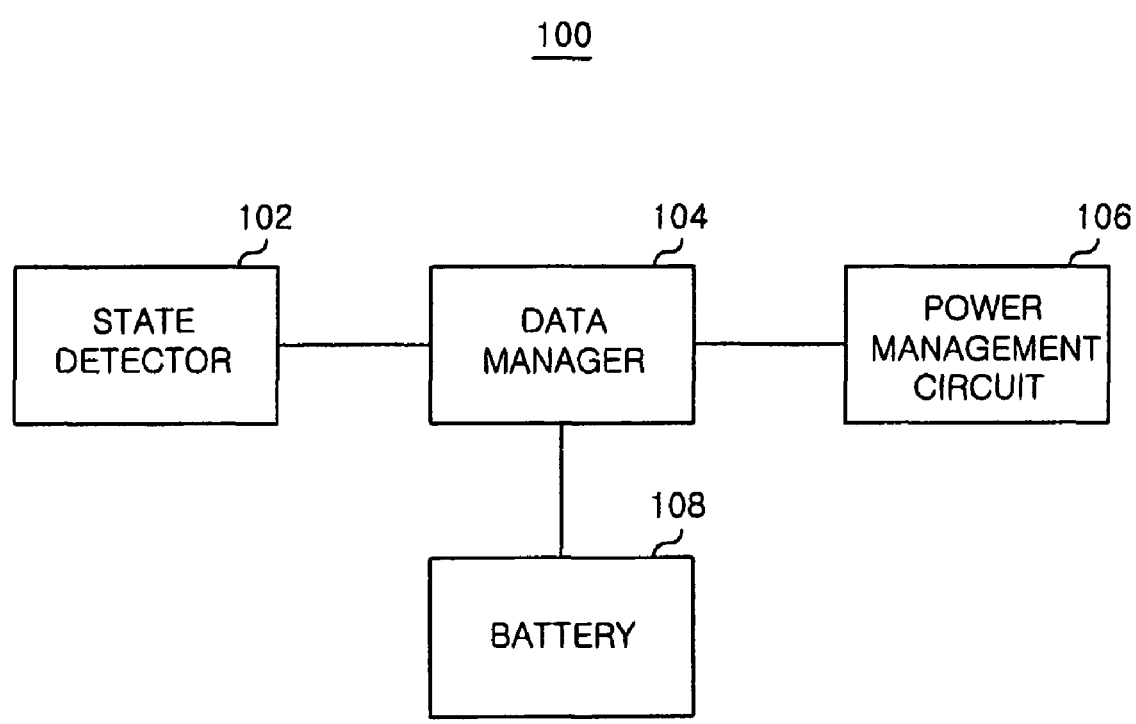
FIG. 1 schematically shows a block diagram of an apparatus for predicting available time of a battery in a mobile device based on usage patterns.

FIG. 1 schematically shows a block diagram of an apparatus for predicting available time of a battery in a mobile device based on usage patterns. As illustrated in FIG. 1, the mobile device 100 includes a state detector 102, a data manager 104, a power management circuit 106, a battery 108.

In general, power consumption of the battery 108 in the mobile device 100 is affected by the usage patterns of the mobile device 100, wherein the usage patterns includes operation states of voice communication, data communication, turned-on LCD of the mobile device, video communication, short message service, application program running, MP3 listening and standby. Among these operation states, it is contemplated that the operation states of voice communication, data communication, turned-on LCD has a large influence on power consumption of the battery. According to the present invention, these states are employed to define, e.g., 8 basic modes as shown in Table 1, which will be described as follows.

The state detector 102 detects the operation states on whether the mobile device 100 is in any of the voice communication, data communication, and turned-on LCD to determine a mode corresponding to the detected operation states with reference to Table 1. The mode determined by the state detector 102 is then provided to the data manager 104. The data manager 104 creates and stores real-time data on power consumption amount of the battery 108 and use time of the battery 108 in each mode provided from the state detector 102.

The power management circuit 106, based on the real-time data created by the data manager 104, calculates an average power consumption rate of the battery 108 per each mode and a use time rate of the battery 108 per each mode. In addition, the power management circuit 106, based on the average power consumption rate of the battery per each mode and the use time rate of the battery per each mode, predicts the available time of the battery 108.

Table 1 below lists a total of 8 modes that are defined under the three operational states of turned-on LCD, voice communication and data communication.

TABLE 1

|  | S0 | S1 | S2 | S3 | S4 | S5 | S6 | S7 |
|---|---|---|---|---|---|---|---|---|
| LCD | O | O | O | O | X | X | X | X |
| Voice communication | O | O | X | X | O | O | X | X |
| Data communication | O | X | O | X | O | X | O | X |

In Table 1, O indicates an operation state of the mobile device 100, and X indicates a non-operation state of the mobile device 100.

A mode S0 denotes a case where a user uses the voice communication (e.g., calling) and the data communication at the same time with the LCD in turn-ON state. This mode does not exist at present but it could exist in future. In this mode, all of the LCD, the voice communication and the data communication affect power consumption of the battery 108.

A mode S1 denotes a case where the user uses only the voice communication with the LCD in turn-ON state. The mode S1, provided that the user starts the voice communication for the first time, becomes active from the connection starting event point of the voice communication. In this mode, both the LCD and the voice communication affect power consumption of the battery 108.

A mode S2 denotes a case where the user uses only the data communication with the LCD in turn-ON state. The mode S2 becomes active from the connection starting event point of the data communication. In this mode, both the LCD and the data communication affect power consumption of the battery.

A mode S3 denotes a case where the user uses neither the voice communication nor the data communication, only with the LCD in turn-ON state. This corresponds to the standby state when a call is incoming or when the user slides up or flips up the mobile device 100. In this mode, only the LCD affects power consumption of the battery.

A mode S4 denotes a case where the user uses the voice communication and the data communication at the same time with the LCD in turn-OFF state. This mode does not exist at present but it could exist in future. In this mode, the voice communication and the data communication affect power consumption of the battery.

A mode S5 denotes a case where the user uses only the voice communication with the LCD in turn-OFF state. This happens after the user has started the voice communication and a certain amount of time has elapsed since then. In this mode, the voice communication affects power consumption of the battery.

A mode S6 denotes a case where the user uses only the data communication with the LCD in turn-OFF state. This mode does not exist at present but it could exist in future. In this mode, the data communication affects power consumption of the battery.

A mode S7 denotes a case where the user uses neither the voice communication nor the data communication with the LCD in turn-OFF state. This corresponds to the standby state when no call is incoming, when the mobile phone is slid down or flipped down, or when the mobile phone is simply time-out. In this mode, a process through periodic connection with a base station affects power consumption of the battery.

Figure 2:
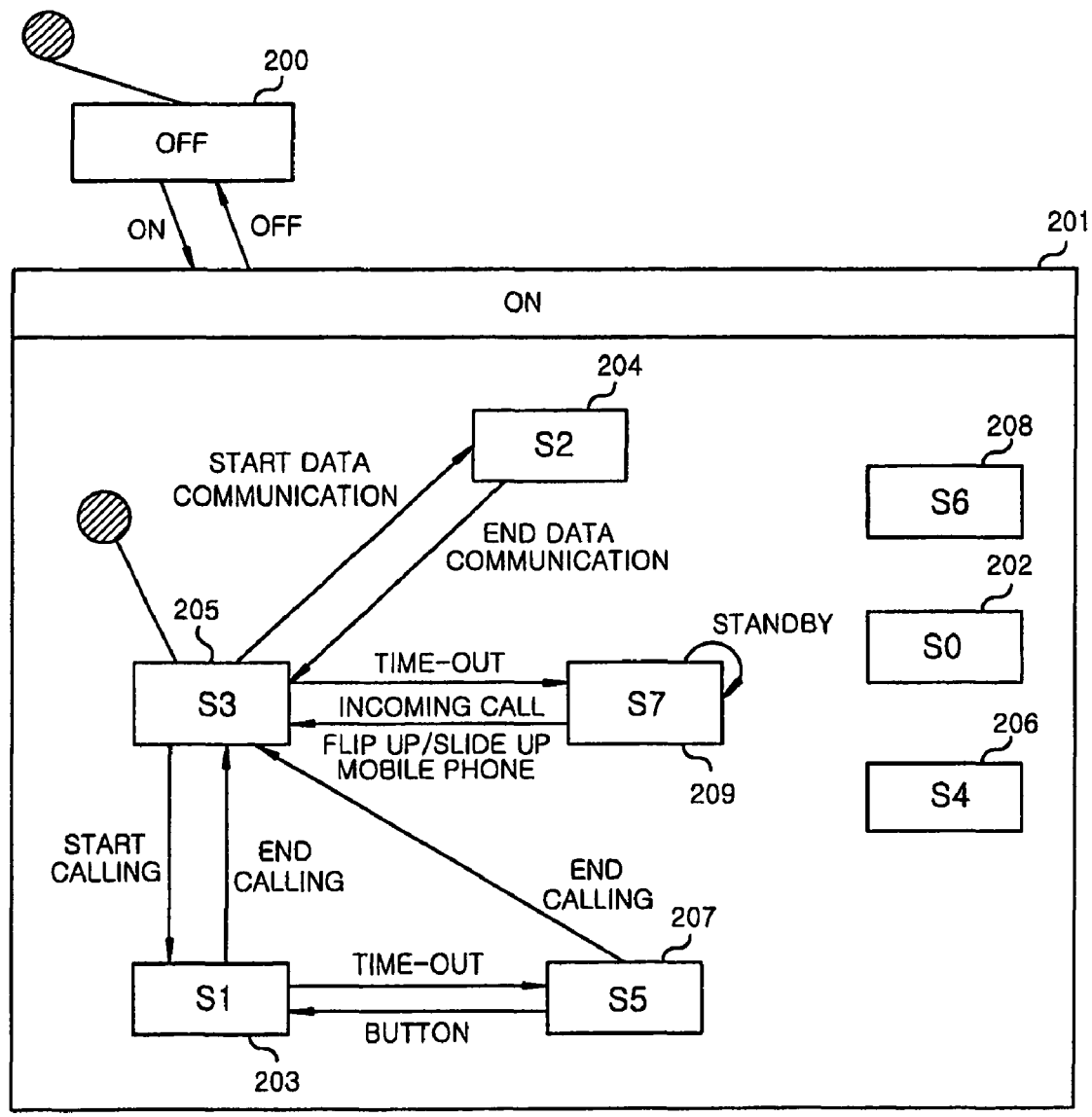
FIG. 2 shows state transition in more than one state that is defined based on operations of mobile device affecting power consumption of a battery.

FIG. 2 shows a diagram illustrating transitions among modes that are defined based on the usage patterns. Referring to FIG. 2, when the user turns the mobile device on, the mobile device changes OFF state 200 to ON state 201. The states of S0 202, S4 206 and S6 208 do not exist in the ON state 201 at present, and even if they would exist in future they are unreachable states now. In the ON state 201, the operation of the mobile device starts with the state of S3 205. When the user starts the voice communication, the mobile device enters the state of S1 203. When the operation of the mobile device becomes time-out after a certain amount of time, the LCD goes turn-off and the mobile device enters the state of S5 207. When the user operates any button on the mobile device 100 in the state of S5 207, the state of the mobile device is changed to the state of S1 203 and then to the state of S3 205 upon completion of the voice communication. If the user starts the data communication, the mobile device enters the state of S2 204 and returns to the state of S3 205 upon completion of the data communication. If the user performs no operation on the mobile device for a certain amount of time till time-out, the mobile device enters the state of S7 209, waiting for an incoming call. After that, if the incoming call is received or the user slides up or flips up the mobile phone to receive the call, the mobile device enters the state of S3 205.

Figure 3:
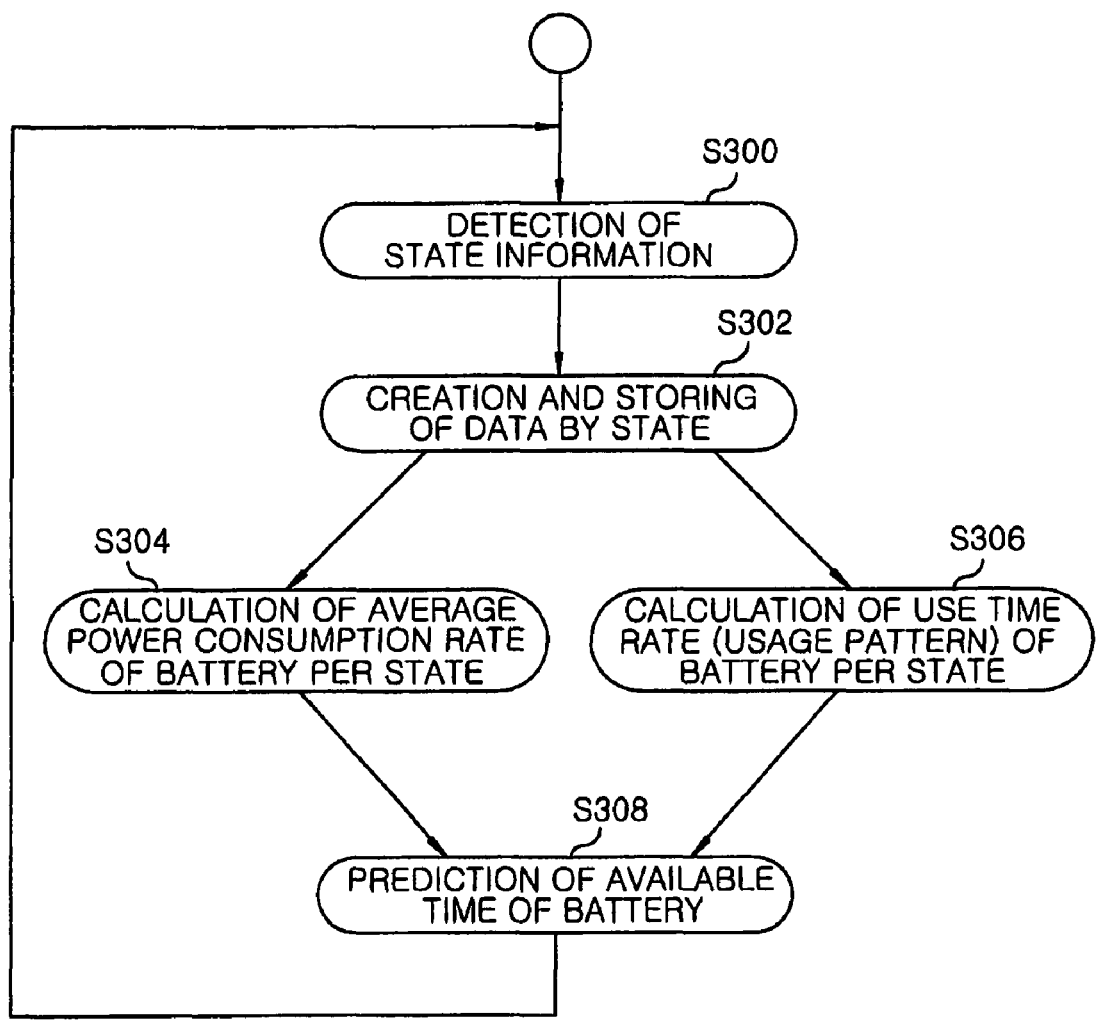
FIG. 3 illustrates an activity diagram showing an overall flow of the present invention.

FIG. 3 illustrates an activity diagram showing an overall flow of the present invention. When the mobile device is turned on, the state detector 102 detects the operational states of the voice communication, the data communication, and the LCD in step s300. The data manager 104 creates and stores the real-time data on the power consumption amount of the battery 108 and the use time of the battery 108 in each state in step s302. The stored data is the time-series data for use in the analysis on the average power consumption rate of the battery in each state and the use time rate of the battery in each state. The power management circuit 106, based on the stored data, calculates the average power consumption rate of the battery per state in step s304, and calculates the use time rate of the battery per state showing the usage pattern of each user in step s306. Moreover, on the basis of the average power consumption rate per state and the use time rate per state, the power management circuit 106 predicts the available time of the battery in step s308.

Figure 4:
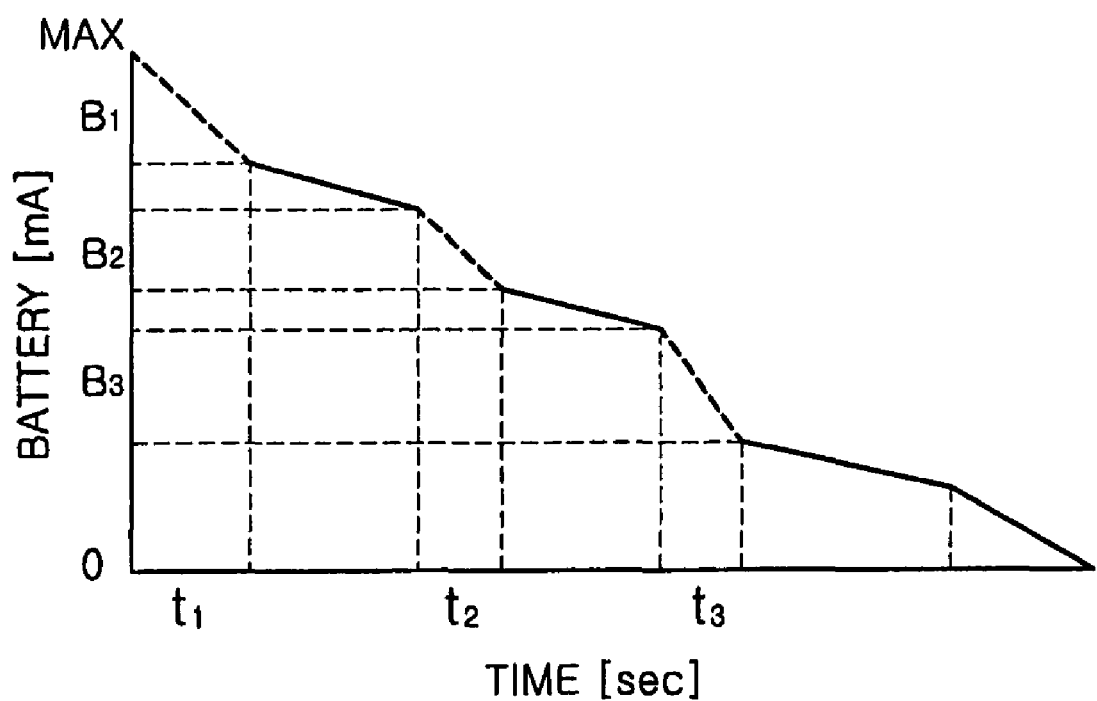
FIG. 4 represents time-series data about power consumption amount and use time of a battery in each state.

FIG. 4 shows a graph illustrating the time-series data about the power consumption amount and the use time of the battery in each state. The graph of FIG. 3 plots the time-series data collected by the data collector, in terms of time and remaining battery capacity. In particular, dotted lines indicate the state of S5 107, that is, the power consumption amount and the use time of the battery in the state where the user uses only the voice communication with the LCD in OFF state. With an arithmetic mean of entire samples of the time-series data in each state, the average power consumption rate per state can be obtained by using Equation 1 below:

$$\alpha_i = \frac{(B_1 + B_2 + B_3)}{(t_1 + t_2 + t_3)} \qquad \text{Equation 1}$$

where $\alpha_i$ is the average power consumption rate (mA/sec) in mode Si, i ranges from 0 to 7, $\beta_j$ is the power consumption amount (mA) for the j-th voice communication, and $t_j$ is call duration of the j-th voice communication or the use time (sec).

The usage pattern of each user can be determined based on his or her use time rate in each state because the rate is different for every user, as a numerical value representing particular usage pattern of users. The use time rate per state can be calculated in many ways. The simplest way is to divide the use time in each state by sum of the use time in all states, based on the time-series data collected by the data collector. This can be formulated as shown in Equation 2 below:

$$\beta_i = \frac{\gamma_i}{\sum_{i=0}^{7} \gamma_i}, \left(\sum_{i=0}^{7} \beta = 1\right) \quad \text{Equation 2}$$

where $\beta_i$ is the power consumption rate in Si mode and $\gamma_i$ is the use time in Si state.

Another way to calculate the use time rate per state is to predict future data based on past time-series data, for example, autoregressive model (AR) or Holt-Winters model. Although the usage pattern of the user is also determined based on the past time-series data, weight factors can be adjusted so that prediction can be done by giving more weight to the recent data.

Autoregressive model takes a regressive pattern of time series itself. In case of following the general p-th order AR process, time-series data $Z_t$ at the present point is expressed in terms of a linear combination of a weighted sum of p past time-series data, $\phi_1 Z_{t-1} + \phi_2 Z_{t-2} + \ldots + \phi_p Z_{t-p}$ and an error term $a_t$ that is inexplicable by the data. The time-series data $Z_t$ in the AR model can be expressed as Equation 3 below:

$$Z_t = \phi_1 Z_{t-1} + \phi_2 Z_{t-2} + \ldots + \phi_p Z_{t-p} + a_t \quad \text{Equation 3}$$

where $Z_i$ is i-th time-series data, $\phi_i$ is a weight for the i-th time-series data, and $a_t$ is an error item.

Holt-Winters model is a prediction method which belongs to an exponential smoothing method for the time-series data. The exponential smoothing method is one of weighted moving average prediction methods, which gives the largest weight to the recent data, exponentially reducing weight as time elapses, and creates the latest data instead of keeping the past data. Holt-Winters algorithm is expressed as a sum of three elements calculated by the exponential smoothing method, wherein the three elements contain baseline, linear trend, and seasonal trend. Holt-Winters models include additive models and multiplicative models. The present invention adopts the multiplicative model, through which estimation can be expressed as Equation 4 below:

$$L_t = \alpha \frac{Y_t}{S_{t-s}} + (1-\alpha)(L_{t-1} + b_{t-1}) \quad \text{Equation 4}$$
$$b_t = \beta(L_t + L_{t-1}) + (1-\beta)b_{t-1}$$
$$S_t = \gamma \frac{Y_t}{L_t} + (1-\gamma)S_{t-s}$$
$$F_{t+m} = (L_t + b_t m)S_{t-s+m}$$

where $Y_t$ is a time-series value that is observed at point t, $L_t$ is a time-series baseline at point t, $b_t$ is a time-series linear trend at point t, $S_t$ is a time-series seasonal trend at point t, $F_{t+m}$ is a estimated value at a estimated point t+m of the point t, S is a seasonal trend length such as the number of days that constitute a week or the number of months that constitute a year, and $\alpha$, $\beta$ and $\gamma$ are smoothing parameters, $0 < \alpha, \beta, \gamma < 1$.

Holt-Winters model in Equation 4 calculates an estimation value for every period of m. In the present invention, m is assumed to be 1 and, therefore, it calculates an estimation value for every period of 1. To apply the Holt-Winters model to the present invention, the smoothing parameters $\alpha$, $\beta$ and $\gamma$ must be given in advance. Most preferably, the smoothing parameters should have values that can minimize an estimation error. As one of conventional methods to set a value of a smoothing parameter, there is a grid search method which calculates an estimation error on some of possible values (0.1, 0.3, 0.5, 0.7, and 0.9) and then uses a value with the least estimation error among the possible values as the smoothing parameter. In the present invention, an optimum smoothing parameter is determined based on the actual use time by the user as well as the available time of the battery estimated by periodically analyzing the usage pattern of the user, followed by dynamically updating the smoothing parameter in order to set and use it as the determined value.

Referring back to FIG. 3, first, the average power consumption rate per each state $\alpha_i$ and the use time rate per state $\beta_i$ which represents the usage pattern of the user are calculated in steps S304 and S306, respectively, and then, from the calculation result, the available time of the battery $\epsilon$ corresponding to the total remaining battery capacity $\delta$ is estimated in step S308. The step S308 is a process where the total remaining battery capacity $\delta$ is divided by a sum of multiplications of the average power consumption rate in every state $\alpha_i$ and the use time rate in every state $\beta_i$. This can be expressed as Equation 5 below:

$$\varepsilon = \frac{\delta}{\sum_{i=0}^{7} \alpha_i \beta_i}, \left(\sum_{i=0}^{7} \beta_i = 1\right) \quad \text{Equation 5}$$

where $\epsilon$ is the estimated available time of the battery (sec), $\delta$ is the total remaining battery capacity (mA), $\alpha_i$ is the average power consumption rate in the state of Si (mA/sec), i ranges from 0 to 7, and $\beta_i$ is the consumption rate in the state of Si.

Since $\alpha_i$ and $\beta_i$ in Equation 5 can be updated on a periodic basis (1 week or 1 month), the Equation 5 can be applied more flexibly for prediction of the available time of the battery even when the battery has aged over time or when the usage pattern of the user changes.

In accordance with the present invention, the available time of the battery in the mobile devices can be calculated accurately on the basis of the usage pattern of each user.

In addition, since the estimated available time of the battery is personalized for individuals based on their usage patterns, the users can use his or her mobile devices more efficiently.

Moreover, it is possible to detect abnormal battery usage or to diagnose problems in the mobile device, by comparing the estimated available time of the battery with the actual use time of the battery.

While the invention has been shown and described with respect to the preferred embodiments, it will be understood by those skilled in the art that various changes and modification may be made without departing from the scope of the invention as defined in the following claims.

What is claimed is:

1. A method for predicting available time of a battery in a mobile device, comprising:
   defining one or more modes depending on usage patterns of the mobile device that affects power consumption of the battery;

creating time-series data about power consumption amount of the battery and use time of the battery in each mode;
calculating, based on the time-series data, average power consumption rate per each mode and use time rate; and
predicting the available time of the battery, based on the average power consumption rate per each mode and the use time rate per each mode,
wherein the use time rate per each mode is derived from an estimation value that is obtained by applying an autoregressive model to the time-series data, the autoregressive model gives more weight to recent data of the time-series data than old data of the time-series data.

2. The method of claim 1, wherein the modes include the operation states of turned-on LCD, voice communication, and data communication of the mobile device, and wherein the modes are defined by one or more combination of the operation states.

3. The method of claim 1, wherein the average power consumption amount per each mode is derived from an arithmetic mean of entire samples of the time-series data per each mode.

4. The method of claim 1, wherein the available time of the battery is estimated by dividing a total remaining battery capacity by a sum of multiplications of the average power consumption rate in every mode and the use time rate in every mode.

* * * * *